US012671395B2

(12) United States Patent
Liu et al.

(10) Patent No.:  US 12,671,395 B2
(45) Date of Patent:  Jun. 30, 2026

(54) PROCESS VOLTAGE TEMPERATURE COMPENSATED CURRENT-STARVED INVERTER RING OSCILLATOR

(71) Applicant: QUALCOMM Incorporated, San Diego, CA (US)

(72) Inventors: Hao Liu, San Diego, CA (US); Lejie Lu, San Diego, CA (US); Yu Song, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 7 days.

(21) Appl. No.: 18/957,115

(22) Filed: Nov. 22, 2024

(65) Prior Publication Data

US 2026/0149432 A1  May 28, 2026

(51) Int. Cl.
 *H03K 3/011*  (2006.01)
 *H03K 3/03*  (2006.01)
 *H03L 7/099*  (2006.01)

(52) U.S. Cl.
 CPC ........... *H03K 3/011* (2013.01); *H03K 3/0315* (2013.01); *H03L 7/0995* (2013.01)

(58) Field of Classification Search
 CPC ..... H03K 3/011; H03K 3/0315; H03L 7/0995
 See application file for complete search history.

(56) References Cited

U.S. PATENT DOCUMENTS

| | | | |
|---|---|---|---|
| 6,400,207 B1 | 6/2002 | Ivanov et al. | |
| 2014/0266476 A1* | 9/2014 | Kuo ................. | H03K 3/356043 331/57 |

| | | | | |
|---|---|---|---|---|
| 2018/0152138 A1* | 5/2018 | Sugita | ................. | H03B 5/1234 |
| 2019/0326890 A1* | 10/2019 | Luzi | ........................ | G11C 27/02 |
| 2022/0247393 A1* | 8/2022 | Helmy Zaky | ...... | H03K 17/6872 |
| 2024/0281012 A1* | 8/2024 | Gao | ........................ | G05F 1/567 |

OTHER PUBLICATIONS

Azcona C., et al., "Precision CMOS Current Reference with Process and Temperature Compensation", 2014 IEEE International Symposium on Circuits and Systems (ISCAS), IEEE, Jun. 1, 2014, pp. 910-913, XP032624572, the whole document, esp. Fig. 2.
Hammam H.H., et al., "An Ultra-Low-Power Process-and-Temperature Compensated Ring Oscillator", 9th International Conference on Electrical and Electronics Engineering (ICEEE), IEEE, Mar. 29, 2022, pp. 1-5, XP034124040, the whole document, esp sections II.A and II.B; Figs. 3-10.
International Search Report and Written Opinion—PCT/US2025/054517—ISA/EPO—Mar. 9, 2026
Mondal S., et al., "A107 u W MedRadio Injection-Locked Clock Multiplier with a CTAT-biased 126 ppm/° C. Ring Oscillator", 2019 IEEE Custom Integrated Circuits Conference (CICC), IEEE, Apr. 14, 2019, 4 Pages, XP033586908, the whole document esp. the abstract, section II, IV; Figs. 2, 3.

* cited by examiner

*Primary Examiner* — Metasebia T Retebo
(74) *Attorney, Agent, or Firm* — Loza & Loza, LLP

(57) ABSTRACT

The apparatus includes: a ring oscillator including a set of cascaded current-starved inverters arranged in a ring; a set of field effect transistors (FETs) coupled in series with the set of cascaded current-starved inverters between an upper voltage rail and a lower voltage rail, respectively; a negative to absolute temperature (NTAT) current source configured to generate a NTAT current; and one or more current mirrors coupling the NTAT current source to the set of FETs.

12 Claims, 6 Drawing Sheets

PROCESS VOLTAGE TEMPERATURE COMPENSATED CURRENT-STARVED INVERTER RING OSCILLATOR

FIELD

This disclosure relates generally to oscillators, and in particular, to a process voltage temperature (PVT) compensated current-starved inverter ring oscillator.

BACKGROUND

A voltage controlled oscillator (VCO) may be configured to generate a clock signal for many different purposes. A clock signal is a substantially periodic signal with a frequency that may vary with a set of one or more parameters. For example, the frequency of the clock signal may be sensitive to several parameters, such as applicable process corner, supply voltage, and operating temperature variation. As the frequency of the clock signal typically affects the operation of a circuit to which the clock signal is provided, it may be desirable to reduce the variation in the frequency of the clock signal with variation in process, voltage, and temperature (PVT).

SUMMARY

The following presents a simplified summary of one or more implementations in order to provide a basic understanding of such implementations. This summary is not an extensive overview of all contemplated implementations, and is intended to neither identify key or critical elements of all implementations nor delineate the scope of any or all implementations. Its sole purpose is to present some concepts of one or more implementations in a simplified form as a prelude to the more detailed description that is presented later.

An aspect of the disclosure relates to an apparatus. The apparatus includes: a ring oscillator including a set of cascaded current-starved inverters arranged in a ring; a set of field effect transistors (FETs) coupled in series with the set of cascaded current-starved inverters between an upper voltage rail and a lower voltage rail, respectively; a negative to absolute temperature (NTAT) current source configured to generate a NTAT current; and one or more current mirrors coupling the NTAT current source to the set of FETs.

Another aspect of the disclosure relates to a method. The method includes: generating a clock signal using a set of cascaded current-starved inverters arranged in a ring, wherein a frequency of the clock signal inherently increases with an increase in a set of one or more parameters; and generating a set of negative to absolute temperature (NTAT) currents to flow through the set of cascaded current-starved inverters to reduce the inherent increase in the frequency of the clock signal with the increase in the set of one or more parameters.

To the accomplishment of the foregoing and related ends, the one or more implementations include the features hereinafter fully described and particularly pointed out in the claims. The following description and the annexed drawings set forth in detail certain illustrative aspects of the one or more implementations. These aspects are indicative, however, of but a few of the various ways in which the principles of various implementations may be employed and the description implementations are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts. The term "substantially" means that the associated parameter may not be exact as indicated but accounts for some variation due to specified tolerances.

Figure 1:
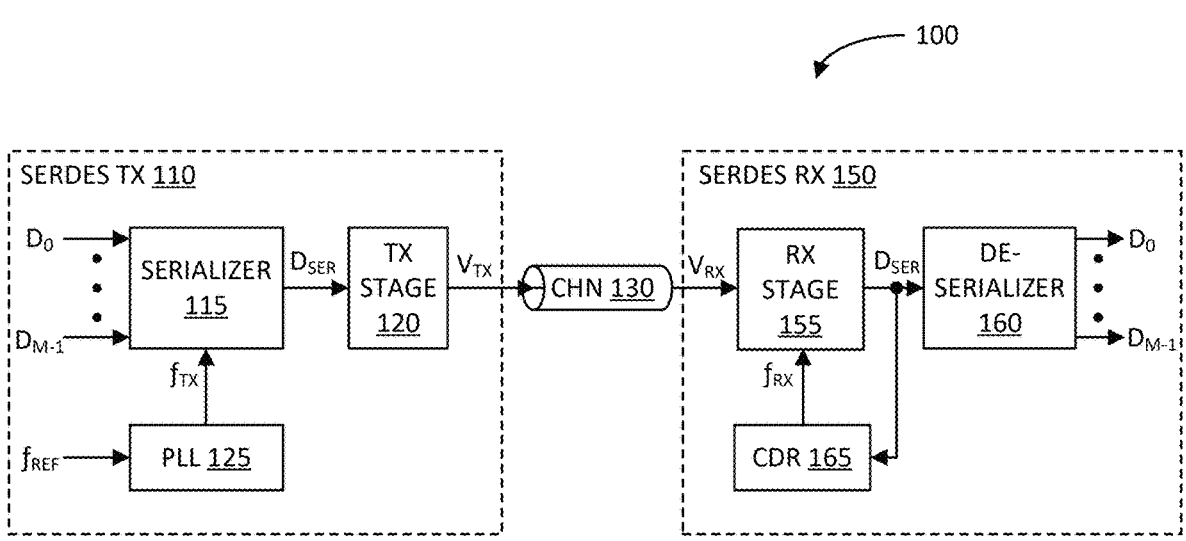
FIG. 1 illustrates a block diagram of an example serializer/deserializer (SERDES) data communication system in accordance with an aspect of the disclosure.

FIG. 1 illustrates a block diagram of an example serializer/deserializer (SERDES) data communication system 100 in accordance with an aspect of the disclosure. The SERDES data communication system 100 includes a SERDES transmitter (Tx) 110 coupled to a SERDES receiver (Rx) 150 via a communication channel 130. In this example, the SERDES data communication system 100 is shown to include a single unidirectional data lane. However, it shall be understood that the SERDES data communication system 100 may include a set of unidirectional and/or bidirectional data lanes.

The SERDES transmitter 110 includes a serializer 115, a transmit (Tx) stage 120, and a phase locked loop (PLL) 125. The serializer 115 is configured to serialize input parallel data $D_0$ to $D_{M-1}$ into a serial data $D_{SER}$ based on a transmit clock signal $f_{TX}$. The PLL 125 is configured to generate the transmit clock signal $f_{TX}$ that is phase/frequency locked to a reference clock signal $f_{REF}$. The transmitter (Tx) stage 120, which may include one or more cascaded transmit drivers, is configured to power amplify the serialize data $D_{SER}$ to generate a transmit signal $V_{TX}$. The SERDES transmitter 110 is configured to provide the transmit signal $V_{TX}$ to the communication channel 130 for transmission to the SERDES receiver 150.

The SERDES receiver 150 includes a receiver (Rx) stage 155, a clock and data recovery (CDR) 165, and a deserializer 160. The receiver stage 155, which may include a variable gain amplifier (VGA), an equalizer (e.g., a continuous time linear equalizer (CTLE), a decision feedback equalizer (DFE), or other), a data sampler/slicer/detector, etc., is configured to receive a received signal $V_{RX}$ (which may be the transmit signal $V_{TX}$ after undergoing the transmission via the communication channel 130) and amplify, equalize, and detect data in the received signal $V_{RX}$ based on a receive clock signal $f_{RX}$ to generate a serial data $D_{SER}$. The CDR 165 may be configured to generate the receive clock signal $f_{RX}$ based on the serial data $D_{SER}$. The deserializer 160 is configured to deserialize the serial data $D_{SER}$ to generate a set of parallel data $D_0$ to $D_{M-1}$.

Figure 2:
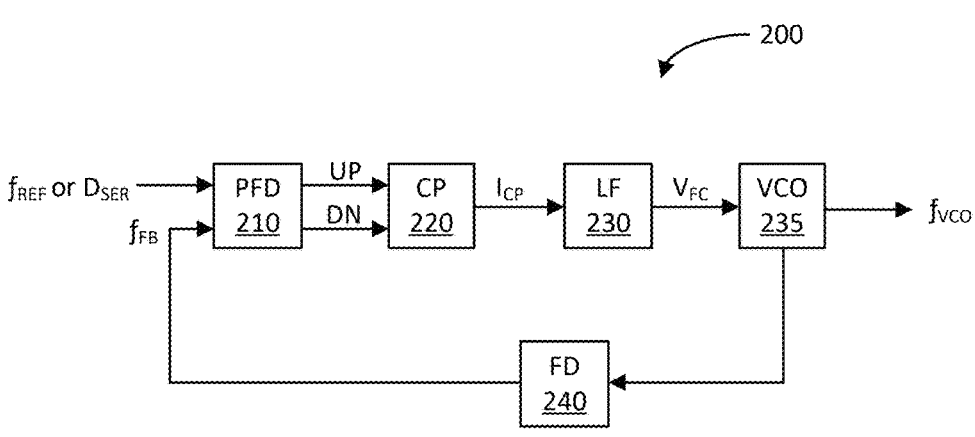
FIG. 2 illustrates a block diagram of an example phase locked loop (PLL) in accordance with another aspect of the disclosure.

FIG. 2 illustrates a block diagram of an example phase locked loop (PLL) 200 in accordance with another aspect of the disclosure. The PLL 200 may be an example implementation of the PLL 125 in SERDES transmitter 110 and/or the CDR 165 in SERDES receiver 150. In particular, the PLL 200 includes a phase/frequency detector (PFD) 210, a charge pump (CP) 220, a loop filter (LF) 230, a voltage controlled oscillator (VCO) 235, and a frequency divider (FD) 240.

The phase/frequency detector 210 is configured to generate a charge pump control signal UP/DN based on a phase/frequency comparison of a feedback clock signal $f_{FB}$ with the reference clock signal f REF or the serial data $D_{SER}$. More specifically, the phase/frequency detector 210 is configured to: assert/deassert the UP/DN signal based on the phase/frequency of the feedback signal $f_{FB}$ lagging the phase/frequency of the reference clock signal $f_{REF}$ or serial data $D_{SER}$; or deassert/assert the UP/DN signal based on the phase/frequency of the feedback signal $f_{FB}$ leading the phase/frequency of the reference clock signal $f_{REF}$ or serial data $D_{SER}$.

The charge pump 220 is configured to generate a current $I_{CP}$ based on the UP/DN signal from the phase/frequency detector 210. In particular, the charge pump (CP) 220 is configured to increase the current $I_{CP}$ based on the UP/DN signal being asserted/deasserted; and to decrease the current $I_{CP}$ based on the UP/DN signal being deasserted/asserted. The loop filter 230 is configured to filter (e.g., low pass filter) or integrate the charge pump current $I_{CP}$ to generate a frequency control signal VFC. The VCO 235 is configured to generate a clock signal $f_{VCO}$ (e.g., $f_{TX}$ or $f_{RX}$) based on the frequency control signal VFC. The frequency divider 240 is configured to frequency divide the clock signal $f_{TX}$ or $f_{RX}$ to generate the feedback signal $f_{FB}$.

Figure 3:
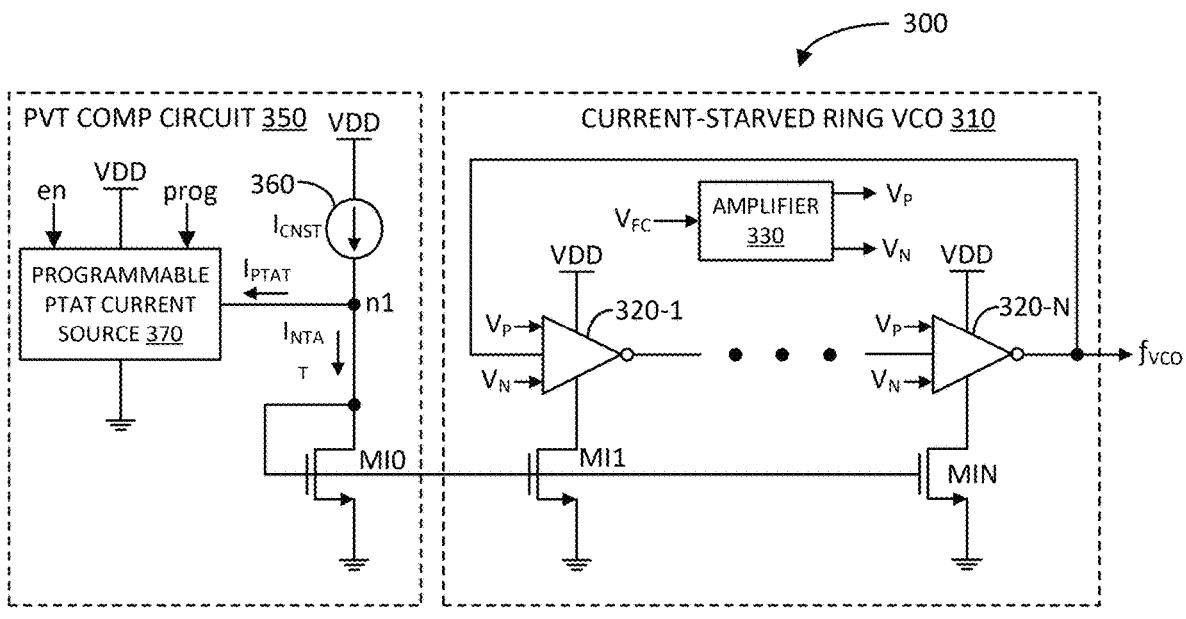
FIG. 3 illustrates a block diagram of an example voltage controlled oscillator (VCO) in accordance with another aspect of the disclosure.

FIG. 3 illustrates a block diagram of an example voltage controlled oscillator (VCO) 300 in accordance with another aspect of the disclosure. The VCO 300 includes a current-starved ring voltage controlled oscillator (VCO) 310 and a process, voltage, temperature (PVT) compensation circuit 350.

The current-starved ring VCO 310 includes a set of cascaded current-starved inverters 320-1 to 320-N arranged in a ring, wherein N may be an odd integer. The ring configuration may entail the current-starved inverters 320-1 to 320-N including respective outputs coupled to respective inputs of the current-starved inverters 320-2 to 320-1 in a round-robin or modulo-N manner. The set of current-starved inverters 320-1 to 320-N are coupled in series with a set of n-channel field effect transistors (NFETs) MI1 to MIN (e.g., specifically with respect to their drain and source terminals) between an upper voltage rail VDD and a lower voltage rail (e.g., ground).

The current-starved ring VCO 310 further includes an amplifier 330 configured to receive a frequency control signal VFC, and generate a pair of control signals or voltages $V_P$ and $V_N$ based on the frequency control signal VFC. The pair of voltages $V_P$ and $V_N$ are applied to the set of current-starved inverters 320-1 to 320-N to control the current through the inverters based on the frequency-control signal VFC; and consequently, the frequency of the VCO clock signal $f_{VCO}$ (e.g., the higher current, the greater is the frequency; the lower current, the lesser is the frequency). The VCO clock signal $f_{VCO}$ may be generated at the output of any of the current-starved inverters 320-1 to 320-N (e.g., at the output of current-starved inverter 320-N), which may be buffered by one or more cascaded buffers or inverters.

The PVT compensation circuit 350 includes a constant current source 360, a diode-connected NFET MI0, and a programmable proportional to absolute temperature (PTAT) current source 370. The constant current source 360 is coupled in series with the diode-connected NFET MI0 between the upper voltage rail VDD and the lower voltage rail (e.g., ground). The programmable PTAT current source 370 is also coupled between the upper voltage rail VDD and the lower voltage rail. The programmable PTAT current source 370 includes an input coupled to a node n1 between the constant current source 360 and the drain/gate of the NFET MI0, where the NFET MI0 includes a source coupled to the lower voltage rail. The drain/gate of the NFET MI0 is coupled to the gates of the set of NFETs MI1 to MIN of the current-starved ring VCO 310.

The PVT compensation circuit 350 is configured to reduce variation in the inherent or uncompensated frequency of the VCO clock signal $f_{VCO}$ with variation with operating temperature, supply voltage VDD, and process corners. As discussed further herein, the frequency of the VCO clock signal $f_{VCO}$ generally varies in the same direction with temperature, supply voltage VDD, and process corner. For example, as the temperature increases, the frequency of the VCO clock signal $f_{VCO}$ increases. As the supply voltage VDD increases, the frequency of the VCO clock signal $f_{VCO}$ increases. For faster process corners, the frequency of the VCO clock signal $f_{VCO}$ is higher.

The PVT compensation circuit 350 operates as follows: As the operating temperature of the VCO 300 increases, the programmable PTAT current source 370 is configured to draw more PTAT current $I_{PTAT}$ from node n1. The constant current source 360 is configured to generate a substantially constant current source $I_{CNST}$ flowing to node n1. As the programmable PTAT current source 370 draws more PTAT current $I_{PTAT}$ from node n1 (via a first current path) with increasing temperature, and a substantially constant current $I_{CNST}$ is provided to node n1, this produces a negative to absolute temperature (NTAT) current $I_{NTAT}$ that flows from node n1 (via a second current path) through the diode-connected NFET MI0.

Via a current-mirror coupling between the diode-connected NFET MI0 and the set of NFETs MI1 to MIN (e.g., having substantially the same gate-to-source voltage $V_{GS}$), the NTAT current $I_{NTAT}$ is mirrored to the set of NFETs MI1 to MIN. The mirrored NTAT currents $I_{NTAT}$ flowing through the set of NFETs MI1 to MIN decreases the currents through the set of current-starved inverters 320-1 to 320-N with increasing temperature. Accordingly, the mirrored NTAT currents $I_{NTAT}$ flowing through the set of NFETs MI1 to MIN has a tendency to reduce the frequency of the VCO clock signal with increasing temperature, which counters the inherent increase in the frequency of the VCO clock signal with increasing temperature.

Similar compensation operations apply to increasing supply voltage VDD and faster process corners. That is, if the supply voltage VDD increases, the programmable PTAT current source 370 increases the PTAT current $I_{PTAT}$, which causes the NTAT current $I_{NTAT}$ flowing through the NFET MI0 to decrease. Consequently, the mirrored NTAT currents flowing through the set of NFETs MI1 to MIN causes the currents through the set of the current-starved inverters 320-1 to 320-N to decrease, which counters the inherent tendency of the VCO 300 to increase the frequency of the VCO clock signal $f_{VCO}$ with increasing supply voltage VDD.

Similarly, if the process corner associated with the VCO 300 is fast, the programmable PTAT current source 370 draws higher PTAT current $I_{PTAT}$ from node n1, which causes the NTAT current $I_{NTAT}$ flowing through the NFET MI0 to decrease. Consequently, the mirrored NTAT currents flowing through the set of NFETs MI1 to MIN causes the currents through the set of current-starved inverters 320-1 to 320-N to decreases, which counters the inherent tendency of the VCO 300 to generate higher frequency of the VCO clock signal $f_{VCO}$ with faster process corners.

As depicted, and as discussed in more detail further herein, the programmable PTAT current source 370 may receive an enable (en) control signal for selectively enabling/disabling the programmable PTAT current source 370. Additionally, the programmable PTAT current source 370 may also receive a program control signal for controlling the magnitude of the PTAT current $I_{PTAT}$ from, for example, zero (0) magnitude to three times (3×) the minimum PTAT current normalized to 1×.

Figure 4:
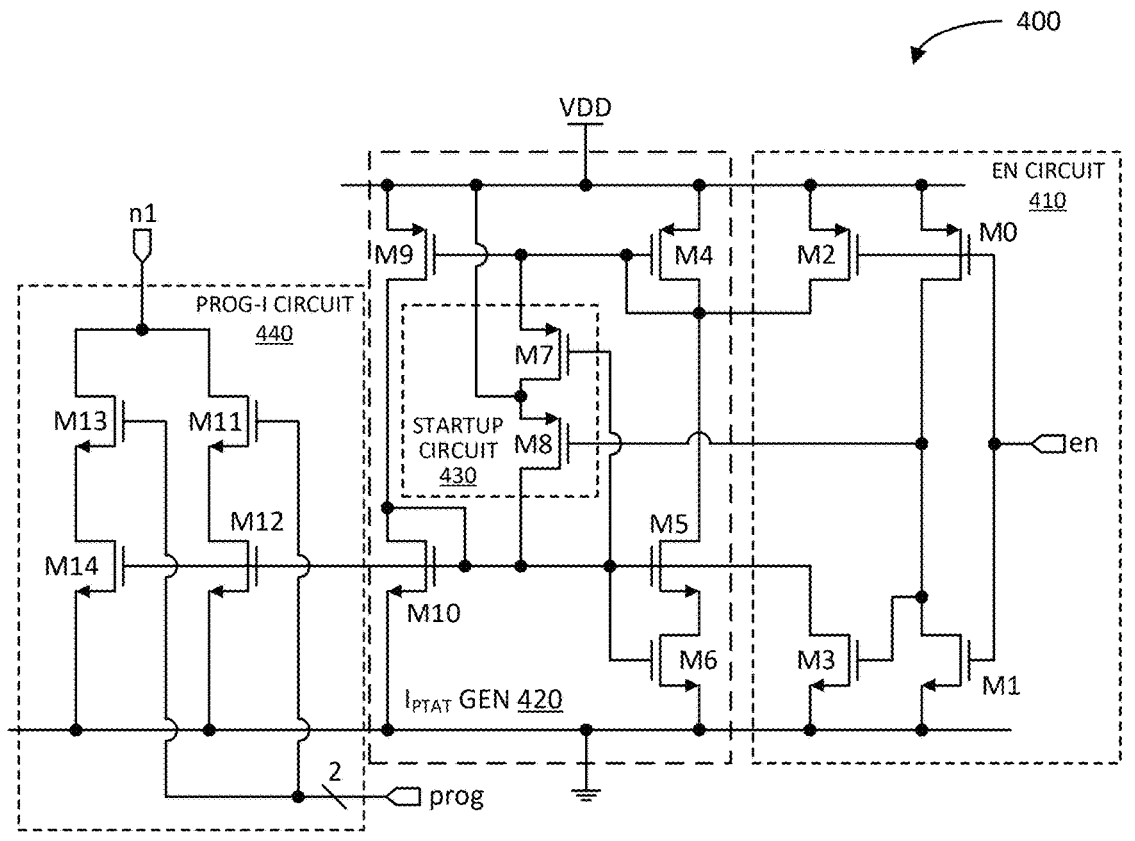
FIG. 4 illustrates a schematic diagram of an example programmable proportional to absolute temperature (PTAT) current source in accordance with another aspect of the disclosure.

FIG. 4 illustrates a block diagram of an example programmable proportional to absolute temperature (PTAT) current source 400 in accordance with another aspect of the disclosure. The programmable PTAT current source 400 may be an example implementation of the programmable PTAT current source 370. In particular, the programmable PTAT current source 400 includes an enable (EN) circuit 410, an $I_{PTAT}$ current generator 420, a startup circuit 430 for the $I_{PTAT}$ current generator 420, and a programmable current (I) circuit 440.

The enable circuit 410 includes a PFET M0 coupled in series with an NFET M1 between an upper voltage rail VDD and a lower voltage rail (e.g., ground). That is, the PFET M0 includes a source coupled to the upper voltage rail VDD and a drain coupled to a drain of the NFET M1. The NFET M1 includes a source coupled to the lower voltage rail. The PFET M0 and NFET M1 include respective gates coupled together, and configured to receive an enable (en) control signal. The drains of the PFET M0 and NFET M1 are coupled together, and to the startup circuit 430, as discussed in more detail further herein.

The enable circuit 410 further includes a PFET M2 including a source coupled to the upper voltage rail VDD, a gate coupled to the gate of PFET M0, and a source coupled to the $I_{PTAT}$ current generator 420, as discussed in more detail further herein. Additionally, the enable circuit includes an NFET M3 including a drain coupled to the $I_{PTAT}$ current generator 420 as discussed in more detail further herein, a gate coupled to the respective drains of the PFET M0 and NFET M1, and a source coupled to the lower voltage rail.

The $I_{PTAT}$ current generator 420 includes a diode-connected PFET M4, an NFET M5, and another NFET M6 coupled in series between the upper voltage rail VDD and the lower voltage rail. That is, the PFET M4 includes a source coupled to the upper voltage rail VDD, and gate and drain coupled together, and to a drain of NFET M5 and the source of NFET M2 of the enable circuit 410. The NFET M5 includes a source coupled to a drain of NFET M6. The NFET M6 includes a source coupled to the lower voltage rail. The NFET M5 includes a gate coupled to a gate of NFET M6.

The $I_{PTAT}$ current generator 420 further includes a PFET M9 coupled in series with a diode-connected NFET M10 between the upper voltage rail VDD and the lower voltage rail. That is, the PFET M9 includes a source coupled to the upper voltage rail, a gate coupled to the gate/drain of diode-connected PFET M4, and a drain coupled to drain/gate of the diode-connected NFET M10. The NFET M10 includes a source coupled to the lower voltage rail. The drain/gate of the diode-connected NFET M10 are coupled to the gates of NFETs M5 and M6.

The startup circuit 430 includes a pair of PFETs M7 and M8 coupled in series between the gates of PFETs M4/M9 and the gates of NFETs M5/M6/M10. That is, the PFET M7 includes a source coupled to the gates of PFETs M4/M9, a gate coupled to the gates of NFETs M5/M6/M10, and a drain coupled to a source of PFET M8 and the upper voltage rail VDD. The PFET M8 includes a gate coupled to the drains of the PFET M0 and NFET M1 of the enable circuit 410. The PFET M8 includes a drain coupled to the gates of the NFETs M5/M6/M10.

The programmable current (PROG-I) circuit 440 includes an NFET M11 coupled in series with an NFET M12 between an input node n1 and the lower voltage rail (e.g., ground). That is, the NFET M11 includes a drain coupled to the input node n1, a gate configured to receive a program (prog) signal (e.g., the least significant bit (LSB) of a two-bit prog signal), and a source coupled to a drain of NFET M12. The NFET M12 includes a gate coupled to the gates of NFETs M5/M6/M10, and a source coupled to the lower voltage rail.

The programmable current circuit 440 further includes an NFET M13 coupled in series with an NFET M14 between the input node n1 and the lower voltage rail. That is, the NFET M13 includes a drain coupled to the input node n1, a gate configured to receive the program (prog) signal (e.g., the most significant bit (MSB) of the two-bit prog signal), and a source coupled to a drain of NFET M14. The NFET M14 includes a gate coupled to the gates of NFETs M5/M6/M10/M12, and a source coupled to the lower voltage rail. The NFETs M14 and M12 may have binary-weighted sizes (e.g., M12=1×, and M14=2×).

In operation, when the enable (en) control signal is deasserted (e.g., at a logic zero (0) or zero (0) Volt (V)), the PFET M0 turns on, and the NFET M1 turns off. The PFET M0 turned on and the NFET M1 turned off produces a high logic voltage (e.g., at ~VDD) at the drains of the PFET M0 and NFET M1. The high logic voltage turns off PFET M8 to disable the startup circuit 430. The high logic voltage also turns on NFET M3 to ground the gates of the NFETs M5/M6/M10 of the $I_{PTAT}$ current generator 420 and turn off these devices M5/M6/M10. The deasserted enable (en) control signal also turns on PFET M2 to apply VDD to the gates of PFETs M4/M9 of the $I_{PTAT}$ current generator 420, and turn off these devices M4/M9. Accordingly, the $I_{PTAT}$ current generator 420 is disabled in response to the deasserted enable (en) control signal. The programmable current circuit 440 is likewise disabled in response to the deasserted enable (en) control signal as the turning on of NFET M3 also ground the gates of NFETs M12 and M14 of the programmable current circuit 440.

When the enable (en) control signal is asserted, the PFET M0 turns off and the NFET M1 turns on. The PFET M0 turned off and the NFET M1 turned on produces a low logic voltage (e.g., 0V) at the drains of the PFET M0 and NFET M1. The low logic voltage turns off NFET M3 to free up the gates of NFETs M5/M6/M10 of the $I_{PTAT}$ current generator 420, as well as the gates NFETs M12/M14 of the programmable current circuit 440. The asserted enable (en) control signal turns off PFET M2 to free up the gates of PFETs M4/M9.

The low logic voltage at the drains of PFET M0 and NFET M1 also turns on PFET M8 of the startup circuit 430. This causes both PFETs M7 and M8 to turn on and couple the gates of PFETs M4/M9 to the gates of NFETs M5/M6/ M10 with some resistance as the PFETs M7 and M8 may be implemented with relatively weak (e.g., high resistance or small size) PFETs. The turning on of PFETs M7 and M8 lowers the voltage at the gates of PFETs M4/M9 and raises the voltage at the gates of NFETs M5/M6/M10. This causes currents to be generated flowing through PFET M9 and NFET M10, and PFET M4 and NFETs M5 and M6.

The NFET M6 produces a PTAT current, which also flows through PFET M4 and NFET M5. The PFETs M4 and M9 are coupled in a current mirror configuration. Accordingly, the PTAT current flowing through PFET M4 is mirrored to PFET M9 and NFET M10. The NFETs M10 and M5/M6 are also in a current mirror configuration, which mirrors the PTAT current back to PFET M4, NFET M5, and NFET M6, forming a circular loop to effectively latch and stabilize the PTAT current.

The NFET M10 is in a current mirror configuration with NFETs M12 and M14. Accordingly, when the current paths including the NFETs M12 and M14 are enabled based on the program signal, the PTAT current are mirrored to the NFETs M12 and M14 with binary-weighted gains (e.g., 1× for M12, and 2× for M14). For example, if the program signal is 00, then NFETs M11 and M13 are turned off; thereby preventing any current flow into the programmable current circuit 440 from node n1; and effectively disabling the programmable PTAT current source 400. If the program signal is 01, then the NFET M11 is turned on and NFET M13 is turned off. This configures the programmable PTAT current source 400 to draw a 1× PTAT current $I_{PTAT}$ from node n1. If the program signal is 10, then the NFET M11 is turned off and NFET M13 is turned on. This configures the programmable PTAT current source 400 to draw a 2× PTAT current $I_{PTAT}$ from node n1. If the program signal is 11, then both NFETs M11 and M13 are turned on. This configures the programmable PTAT current source 400 to draw a 3× PTAT current $I_{PTAT}$ from node n1.

Figure 5A:
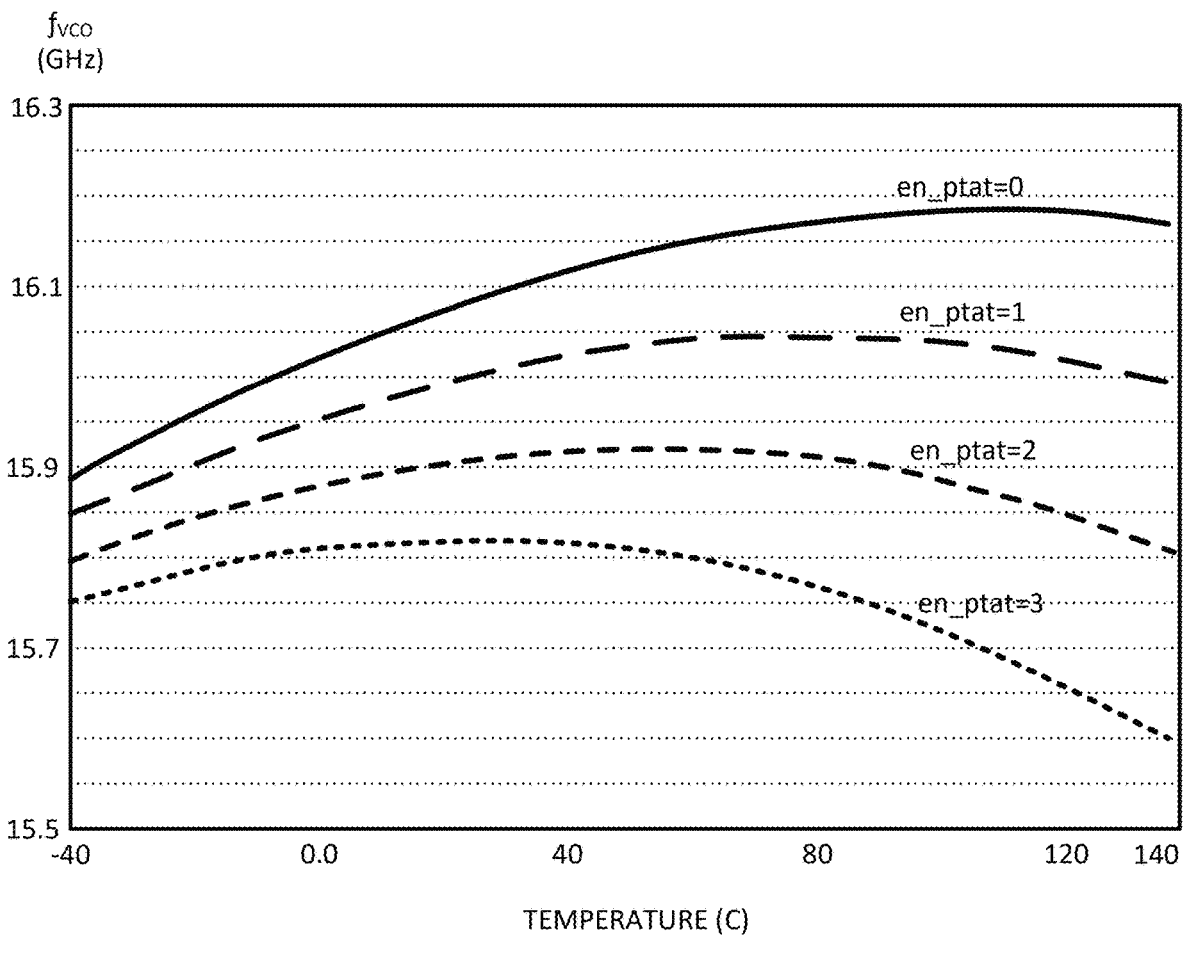
FIG. 5A illustrates a graph of an example relationship between a frequency of a clock signal generated by the VCO of FIG. 3 versus an operating temperature of the VCO of FIG. 3 in accordance with another aspect of the disclosure.

FIG. 5A illustrates a graph of an example relationship between a frequency of a clock signal $f_{VCO}$ generated by the VCO 300 versus the operating temperature of the VCO 300 in accordance with another aspect of the disclosure. The horizontal axis represents temperature in Celsius ranging from −40° C. to 140° C. The vertical axis represents frequency of the VCO clock signal $f_{VCO}$ ranging from 15.5 giga Hertz (GHz) to 16.3 GHz.

The graph depicts four (4) curves representing the relationship between the frequency of the VCO clock signal $f_{VCO}$ versus temperature for the following cases: (1) where the programmable PTAT current source 370 is disabled (e.g., en=0 or prog=00) (represented by a solid line); (2) where the programmable PTAT current source 370 is configured to source 1× PTAT current $I_{PTAT}$ (e.g., en=1 and prog=01) (represented by long dashed line); (3) where the programmable PTAT current source 370 is configured to source 2× PTAT current $I_{PTAT}$ (e.g., en=1 and prog=10) (represented by medium dashed line); and (4) where the programmable PTAT current source 370 is configured to source 3× PTAT current $I_{PTAT}$ (e.g., en=1 and prog=11) (represented by short dashed line).

As the graph illustrates, when the programmable PTAT current source 370 is disabled, the frequency difference across the temperature range of −40° C. to 140° C. is about 300 mega Hertz (MHz). When the programmable PTAT current source 370 is enabled and configured to source a 1× PTAT current $I_{PTAT}$, the frequency difference across the temperature range of −40° C. to 140° C. is about 200 MHz. When the programmable PTAT current source 370 is enabled and configured to source a 2× PTAT current $I_{PTAT}$, the frequency difference across the temperature range of −40° C. to 140° C. is about 120 MHz. And, when the programmable PTAT current source 370 is enabled and configured to source a 3× PTAT current $I_{PTAT}$, the frequency difference across the temperature range of −40° C. to 140° C. is about 220 MHz. Thus, based on these curves, the programmable PTAT current source 370 being enabled and configured to source a 2× PTAT current $I_{PTAT}$ provides the least frequency difference (e.g., 120 MHz) across the temperature range of −40° C. to 140° C.

Figure 5B:
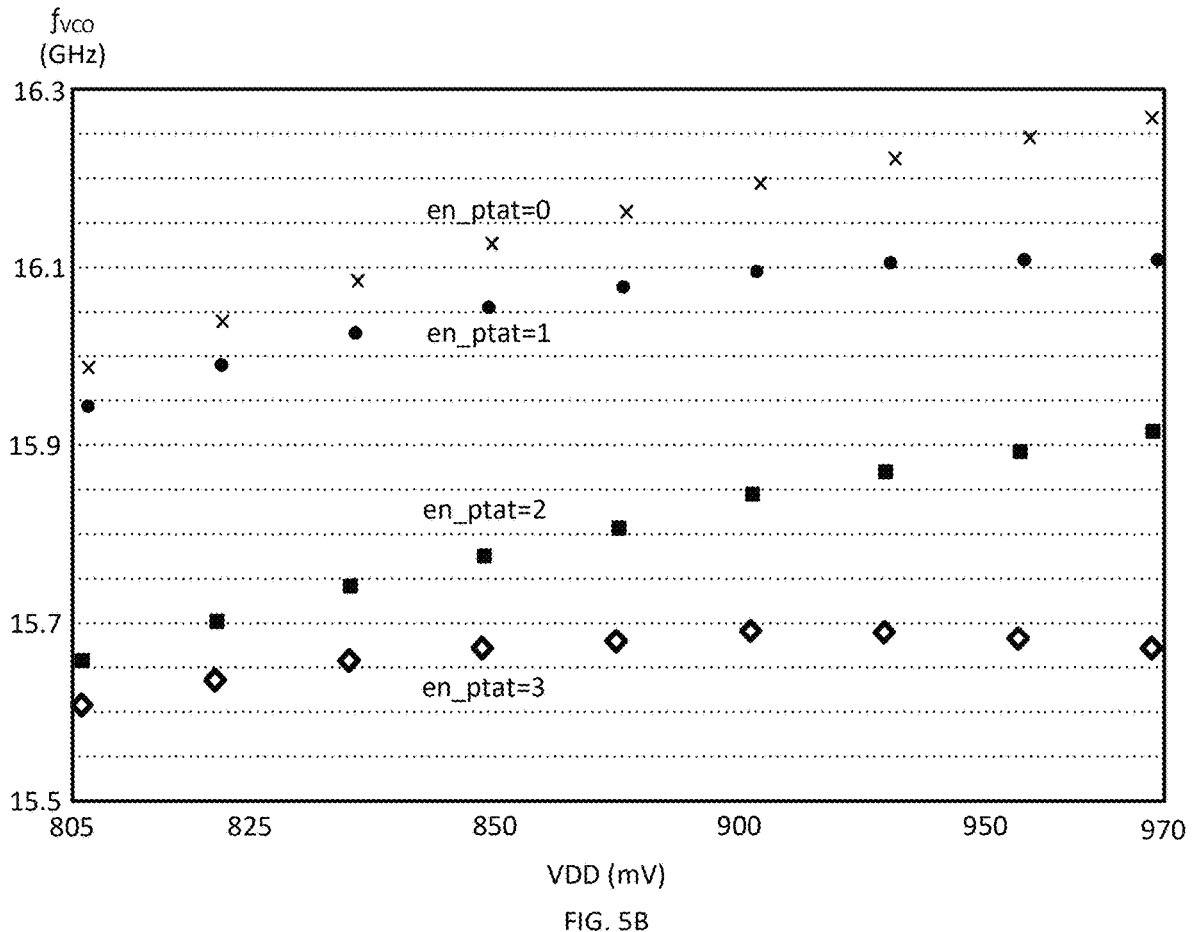
FIG. 5B illustrates a graph of an example relationship between a frequency of a clock signal generated by the VCO of FIG. 3 versus the VCO supply voltage provided to the VCO of FIG. 3 in accordance with another aspect of the disclosure.

FIG. 5B illustrates a graph of an example relationship between a frequency of a clock signal $f_{VCO}$ generated by the VCO 300 versus the VCO supply voltage VDD in accordance with another aspect of the disclosure. The horizontal axis represents the supply voltage VDD ranging from 805 milli Volts (mV) to 970 mV. The vertical axis represents frequency of the VCO clock signal $f_{VCO}$ ranging from 15.5 GHz to 16.3 GHZ.

The graph depicts four (4) curves representing the relationship between the frequency of the VCO clock signal $f_{VCO}$ versus the supply voltage VDD for the following cases: (1) where the programmable PTAT current source 370 is disabled (e.g., en=0 or prog=00) (represented by x symbol points); (2) where the programmable PTAT current source 370 is configured to source 1× PTAT current $I_{PTAT}$ (e.g., en=1 and prog=01) (represented by solid circle symbol points); (3) where the programmable PTAT current source 370 is configured to source 2× PTAT current $I_{PTAT}$ (e.g., en=1 and prog=10) (represented by solid square symbol points); and (4) where the programmable PTAT current source 370 is configured to source 3× PTAT current $I_{PTAT}$ (e.g., en=1 and prog=11) (represented by diamond symbol points).

As the graph illustrates, when the programmable PTAT current source 370 is disabled, the frequency difference across the supply voltage VDD range of 805 mV to 970 mV is about 280 MHz. When the programmable PTAT current source 370 is enabled and configured to source a 1× PTAT current $I_{PTAT}$, the frequency difference across the supply voltage VDD range of 805 mV to 970 mV is about 170 MHz. When the programmable PTAT current source 370 is enabled and configured to source a 2× PTAT current $I_{PTAT}$, the frequency difference across the supply voltage VDD range of 805 mV to 970 mV is about 220 MHz. And, when the programmable PTAT current source 370 is enabled and configured to source a 3× PTAT current $I_{PTAT}$, the frequency difference across the supply voltage VDD range of 805 mV to 970 mV is about 90 MHz. Thus, based on these curves, the programmable PTAT current source 370 being enabled and configured to source a 3× PTAT current $I_{PTAT}$ provides the least frequency difference (e.g., 90 MHz) across the supply voltage VDD range of 805 mV to 970 mV.

Figure 5C:
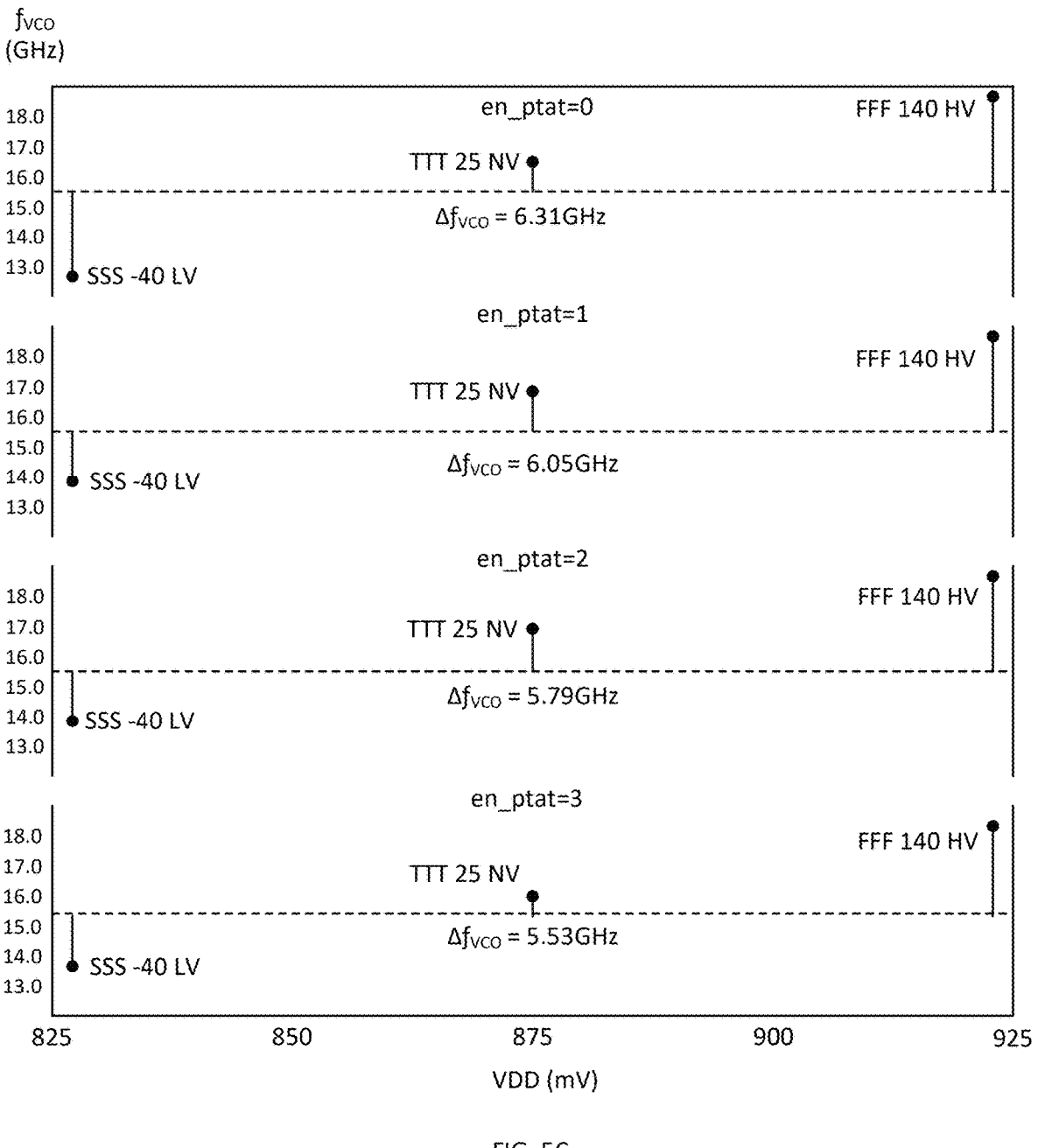
FIG. 5C illustrates a graph of an example relationship between a frequency of a clock signal generated by the VCO of FIG. 3 versus process corners related to the VCO of FIG. 3 in accordance with another aspect of the disclosure.

FIG. 5C illustrates a graph of an example relationship between a frequency of a clock signal $f_{VCO}$ generated by the VCO 300 versus process corners related to the VCO 300 in accordance with another aspect of the disclosure. The horizontal axis represents the supply voltage VDD ranging from 825 mV to 925 mV. The vertical axis, from top to bottom, represents the frequency excursion of the VCO clock signal $f_{VCO}$ between slow-slow-slow (SSS) corner (−40° C., low supply voltage (LV)) and fast-fast-fast corner (140° C. high supply voltage (HV)) for the following cases: (1) where the programmable PTAT current source 370 is disabled (e.g., en=0 or prog=00); (2) where the programmable PTAT current source 370 is configured to source 1× PTAT current $I_{PTAT}$ (e.g., en=1 and prog=01); (3) where the programmable PTAT current source 370 is configured to source 2× PTAT current $I_{PTAT}$ (e.g., en=1 and prog=10); and (4) where the programmable PTAT current source 370 is configured to source 3× PTAT current $I_{PTAT}$ (e.g., en=1 and prog=11).

As the graph illustrates, when the programmable PTAT current source 370 is disabled, the frequency difference across the SSS and FFF process corners is about 6.31 GHz. When the programmable PTAT current source 370 is enabled and configured to source a 1× PTAT current $I_{PTAT}$, the frequency difference across the SSS and FFF process corners is about 6.05 GHz. When the programmable PTAT current source 370 is enabled and configured to source a 2× PTAT current $I_{PTAT}$, the frequency difference across the SSS and FFF process corners is about 5.79 GHz. And, when the programmable PTAT current source 370 is enabled and configured to source a 3× PTAT current $I_{PTAT}$, the frequency difference across the SSS and FFF process corners is about 5.53 GHZ. Thus, based on these curves, the programmable PTAT current source 370 being enabled and configured to source a 3× PTAT current $I_{PTAT}$ provides the least frequency difference (e.g., 5.53 GHz) across the SSS and FFF process corners.

Accordingly, the VCO 300 provides "knobs" or controls to achieve a desired tradeoff between frequency deviation with operating temperature, supply voltage VDD and/or process corners.

Figure 6:
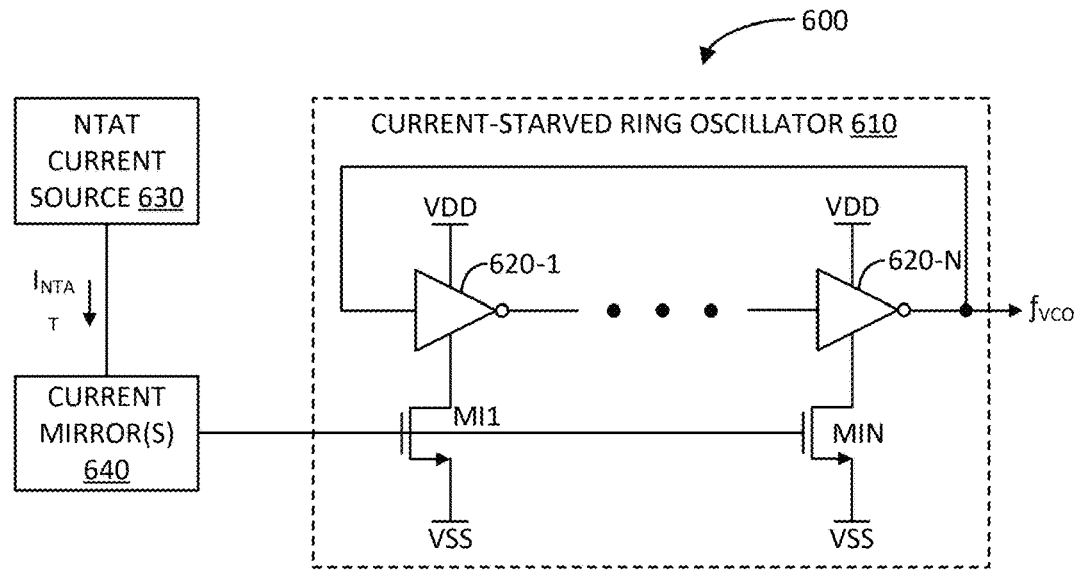
FIG. 6 illustrates a block diagram of another example voltage controlled oscillator (VCO) in accordance with another aspect of the disclosure.

FIG. 6 illustrates a block diagram of another example apparatus (e.g., an oscillator) 600 in accordance with another aspect of the disclosure. The apparatus 600 includes a current-starved ring oscillator 610 including a set of cascaded current-starved inverters 620-1 to 620-N arranged in a ring, and a set of field effect transistors (FETs) MI1 to MIN coupled in series with the set of cascaded current-starved inverters 320-1 to 320-N between an upper voltage rail VDD and a lower voltage rail VSS, respectively. The apparatus 600 further includes a negative to absolute temperature (NTAT) current source 630 configured to generate a NTAT current $I_{NTAT}$. Additionally, the apparatus 600 includes one or more current mirrors 640 coupling the NTAT current source 630 to the set of FETs MI1 to MIN.

Figure 7:
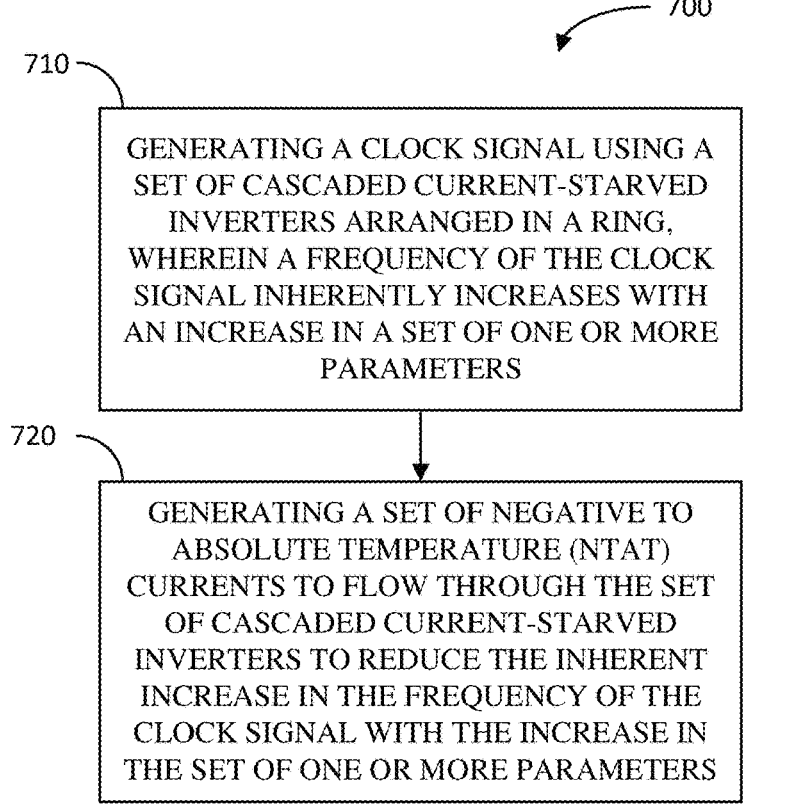
FIG. 7 illustrates a flow diagram of an example method of generating a clock signal in accordance with another aspect of the disclosure.

FIG. 7 illustrates a flow diagram of an example method 700 of generating a clock signal in accordance with another aspect of the disclosure. The method 700 includes generating a clock signal using a set of cascaded current-starved inverters arranged in a ring, wherein a frequency of the clock signal inherently increases with an increase in a set of one or more parameters (block 710). Examples of means for generating a clock signal using a set of cascaded current-starved inverters arranged in a ring includes any of the ring oscillators 300 and 610 described herein.

The method 700 further includes generating a set of negative to absolute temperature (NTAT) currents to flow through the set of cascaded current-starved inverters to reduce the inherent increase in the frequency of the clock signal with the increase in the set of one or more parameters (block 720). Examples of means for generating a set of negative to absolute temperature (NTAT) currents to flow through the set of cascaded current-starved inverters to reduce the inherent increase in the frequency of the clock signal with the increase in the set of one or more parameters include any of the components PVT compensation circuit 350, NTAT current source 630, one or more current mirrors 640, and the set of NFETs MI0 to MIN described herein.

The following provides an overview of aspects of the present disclosure:

Aspect 1: An apparatus, comprising: a ring oscillator including a set of cascaded current-starved inverters arranged in a ring; a set of field effect transistors (FETs) coupled in series with the set of cascaded current-starved inverters between an upper voltage rail and a lower voltage rail, respectively; a negative to absolute temperature (NTAT) current source configured to generate a NTAT current; and one or more current mirrors coupling the NTAT current source to the set of FETs.

Aspect 2: The apparatus of aspect 1, wherein the NTAT current source comprises: a constant current source configured to generate a substantially constant current towards a node; and a positive to absolute temperature (PTAT) current source configured to generate a PTAT current from the node, wherein the node is situated between the constant current source and the one or more current mirrors.

Aspect 3: The apparatus of aspect 2, wherein the PTAT current source is configured to change the PTAT current based on a control signal.

Aspect 4: The apparatus of aspect 2, wherein the PTAT current source is configured to generate a set of increasing PTAT currents including the PTAT current based on a control signal.

Aspect 5: The apparatus of aspect 2, wherein the PTAT current source is configured to cease generating the PTAT current source based on a control signal.

Aspect 6: The apparatus of claim 2, wherein the PTAT current source comprises: an enable circuit; a PTAT current generator coupled to the enable circuit; and a startup circuit coupled to the enable circuit and the PTAT current generator.

Aspect 7: The apparatus of aspect 6, wherein the PTAT current generator comprises: a first p-channel field effect transistor (PFET) coupled in series with a diode-connected n-channel field effect transistor (NFET) between the upper voltage rail and the lower voltage rail; and a diode-connected PFET, a first NFET, and a second NFET all coupled in series between the upper voltage rail and the lower voltage rail, wherein the diode-connected PFET and the first PFET include respective gates coupled together, and wherein the diode-connected NFET, the first NFET, and the second NFET include respective gates coupled together.

Aspect 8: The apparatus of claim 7, wherein the enable circuit comprises: a second PFET coupled in series with a third NFET between the upper voltage rail and the lower voltage rail, wherein the second PFET and the third NFET include respective gates configured to receive an enable control signal; a third PFET including a source coupled to the upper voltage rail, a gate coupled to the gate of the second PFET, and a drain coupled to the gates of the diode-connected PFET and the first PFET of the PTAT current generator; and a fourth NFET including a gate coupled to respective drains of the second PFET and the third NFET, a drain coupled to the respective gates of the diode-connected NFET, the first NFET, and the second NFET, and a source coupled to the lower voltage rail.

Aspect 9: The apparatus of aspect 8, wherein the startup circuit comprises a fourth PFET and a fifth PFET coupled in series between the gate of the diode-connected PFET and the gate of the diode-connected NFET, wherein the fourth PFET includes a gate coupled to the gate of the diode-connected NFET, wherein the fifth PFET includes a gate coupled to respective drains of the second PFET and the third NFET, and wherein the upper voltage rail is coupled to a drain of the fourth PFET and to a source of the fifth PFET.

Aspect 10: The apparatus of anyone of aspects 6-9, wherein the PTAT current source comprises a programmable current circuit coupled to the PTAT current generator.

Aspect 11: The apparatus of aspect 10, wherein the programmable current circuit comprises: a first NFET coupled in series with a second NFET between the node and the lower voltage rail, wherein the first NFET includes a gate configured to receive a first bit of a program current control signal, and wherein the second NFET includes a gate coupled to the PTAT current generator; and a third NFET coupled in series with a fourth NFET between the node and the lower voltage rail, wherein the third NFET includes a gate configured to receive a second bit of the program current control signal, and wherein the fourth NFET includes a gate coupled to the PTAT current generator.

Aspect 12: The apparatus of any one of aspects 1-11, wherein the one or more current mirrors comprises a diode-connected FET coupled in series with the NTAT current source between the upper voltage rail and the lower voltage rail, wherein the diode-connected FET includes a gate coupled to respective gates of the set of FETs.

Aspect 13: The apparatus of aspect 12, wherein the FET and the set of FETs each comprises an n-channel field effect transistor (NFET).

Aspect 14: The apparatus of any one of aspects 1-13, wherein the set of cascaded current-starved inverters are each configured to receive one or more control signals to control a frequency of a clock signal generated by the ring oscillator.

Aspect 15: The apparatus of any one of aspects 1-14, further comprising an amplifier configured to generate a positive control signal and a negative control signal based on a frequency-control signal, wherein the positive and negative control signals are configured to control a current through each of the set of cascaded current-starved inverters.

Aspect 16: A method, comprising: generating a clock signal using a set of cascaded current-starved inverters arranged in a ring, wherein a frequency of the clock signal inherently increases with an increase in a set of one or more parameters; and generating a set of negative to absolute temperature (NTAT) currents to flow through the set of cascaded current-starved inverters to reduce the inherent increase in the frequency of the clock signal with the increase in the set of one or more parameters.

Aspect 17: The method of aspect 16, wherein the set of one or more parameters comprises an operating temperature of the set of cascaded current-starved inverters.

Aspect 18: The method of aspect 16 or 17, wherein the set of one or more parameters comprises a supply voltage provided to the set of cascaded current-starved inverters.

Aspect 19: The method of any one of aspects 16-18, wherein the set of one or more parameters comprises a process corner associated with the set of cascaded current-starved inverters.

Aspect 20: The method of any one of aspects 16-19, wherein generating the set of NTAT currents comprises: generating a substantially constant current flowing to a node; generating a proportional to absolute temperature (PTAT) current flowing from the node in a first current path direction, wherein a NTAT current flows from the node in a second current path direction; and mirroring the NTAT current to a set of field effect transistors (FETs) coupled in series with the set of cascaded current starved inverters between an upper voltage rail and a lower voltage rail, respectively.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed:

1. An apparatus, comprising:
a ring oscillator including:
  a set of cascaded current-starved inverters arranged in a ring; and
  a set of field effect transistors (FETs) coupled in series with the set of cascaded current-starved inverters between an upper voltage rail and a lower voltage rail, respectively;
a negative to absolute temperature (NTAT) current source configured to generate a NTAT current, the NTAT current source comprising
  a constant current source configured to generate a substantially constant current towards a node, and
  a positive to absolute temperature (PTAT) current source configured to generate a PTAT current from the node, wherein the node is situated between the constant current source and the one or more current mirrors, wherein the PTAT current source comprises an enable circuit,
  a startup circuit coupled to the enable circuit, and
  a PTAT current generator coupled to the enable circuit and the startup circuit, the PTAT current generator comprising
    a first p-channel field effect transistor (PFET) coupled in series with a diode-connected n-channel field effect transistor (NFET) between the upper voltage rail and the lower voltage rail, and
    a diode-connected PFET, a first NFET, and a second NFET all coupled in series between the upper voltage rail and the lower voltage rail, wherein the diode-connected PFET and the first PFET include respective gates coupled together, and wherein the diode-connected NFET, the first NFET, and the second NFET include respective gates coupled together; and
  one or more current mirrors coupling the NTAT current source to the set of FETs.

2. The apparatus of claim 1, wherein the PTAT current source is configured to change the PTAT current based on a control signal.

3. The apparatus of claim 1, wherein the PTAT current source is configured to generate a set of increasing PTAT currents including the PTAT current based on a control signal.

4. The apparatus of claim 1, wherein the PTAT current source is configured to cease generating the PTAT current source based on a control signal.

5. The apparatus of claim 1, wherein the enable circuit comprises:

a second PFET coupled in series with a third NFET between the upper voltage rail and the lower voltage rail, wherein the second PFET and the third NFET include respective gates configured to receive an enable control signal;

a third PFET including a source coupled to the upper voltage rail, a gate coupled to the gate of the second PFET, and a drain coupled to the gates of the diode-connected PFET and the first PFET of the PTAT current generator; and a fourth NFET including a gate coupled to respective drains of the second PFET and the third NFET, a drain coupled to the respective gates of the diode-connected NFET, the first NFET, and the second NFET, and a source coupled to the lower voltage rail.

6. The apparatus of claim 5, wherein the startup circuit comprises a fourth PFET and a fifth PFET coupled in series between the gate of the diode-connected PFET and the gate of the diode-connected NFET, wherein the fourth PFET includes a gate coupled to the gate of the diode-connected NFET, wherein the fifth PFET includes a gate coupled to respective drains of the second PFET and the third NFET, and wherein the upper voltage rail is coupled to a drain of the fourth PFET and to a source of the fifth PFET.

7. The apparatus of claim 1, wherein the PTAT current source comprises a programmable current circuit coupled to the PTAT current generator.

8. The apparatus of claim 7, wherein the programmable current circuit comprises:

a first NFET coupled in series with a second NFET between the node and the lower voltage rail, wherein the first NFET includes a gate configured to receive a first bit of a program current control signal, and wherein the second NFET includes a gate coupled to the PTAT current generator; and a third NFET coupled in series with a fourth NFET between the node and the lower voltage rail, wherein the third NFET includes a gate configured to receive a second bit of the program current control signal, and wherein the fourth NFET includes a gate coupled to the PTAT current generator.

9. The apparatus of claim 1, wherein the one or more current mirrors comprises a diode-connected FET coupled in series with the NTAT current source between the upper voltage rail and the lower voltage rail, wherein the diode-connected FET includes a gate coupled to respective gates of the set of FETs.

10. The apparatus of claim 9, wherein the FET and the set of FETs each comprises an n-channel field effect transistor (NFET).

11. The apparatus of claim 1, wherein the set of cascaded current-starved inverters are each configured to receive one or more control signals to control a frequency of a clock signal generated by the ring oscillator.

12. The apparatus of claim 1, further comprising an amplifier configured to generate a positive control signal and a negative control signal based on a frequency-control signal, wherein the positive and negative control signals are configured to control a current through each of the set of cascaded current-starved inverters.

* * * * *